US011469296B2

(12) United States Patent
Paul et al.

(10) Patent No.: US 11,469,296 B2
(45) Date of Patent: *Oct. 11, 2022

(54) LOW LEAKAGE FET

(71) Applicant: pSemi Corporation, San Diego, CA (US)

(72) Inventors: Abhijeet Paul, Poway, CA (US); Simon Edward Willard, Irvine, CA (US); Alain Duvallet, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 16/929,988

(22) Filed: Jul. 15, 2020

(65) Prior Publication Data

US 2021/0005709 A1 Jan. 7, 2021

Related U.S. Application Data

(60) Continuation of application No. 16/049,741, filed on Jul. 30, 2018, now Pat. No. 10,756,166, which is a (Continued)

(51) Int. Cl.
*H01L 29/06* (2006.01)
*H01L 21/762* (2006.01)
(Continued)

(52) U.S. Cl.
CPC .... *H01L 29/0607* (2013.01); *H01L 21/76202* (2013.01); *H01L 29/0649* (2013.01);
(Continued)

(58) Field of Classification Search
None
See application file for complete search history.

(56) References Cited

U.S. PATENT DOCUMENTS

| 4,714,519 A | 12/1987 | Pfiester |
| 6,261,886 B1 | 7/2001 | Houston |

(Continued)

FOREIGN PATENT DOCUMENTS

WO 2018226511 12/2018

OTHER PUBLICATIONS

Pham, Long, Office Action received from the USPTO dated Nov. 1, 2017 for U.S. Appl. No. 15/616,811, 10 pgs.

(Continued)

*Primary Examiner* — Long Pham
(74) *Attorney, Agent, or Firm* — Jaquez Land Greenhaus & McFarland LLP; John Land, Esq.

(57) ABSTRACT

FET designs that exhibit low leakage in the presence of the edge transistor phenomenon. Embodiments includes nFET designs in which the work function $\Phi_{MF}$ of the gate structure overlying the edge transistors of the nFET is increased by forming extra P+ implant regions within at least a portion of the gate structure, thereby increasing the Vt of the edge transistors to a level that may exceed the Vt of the central conduction channel of the nFET. In some embodiments, the gate structure of the nFET is modified to increase or "flare" the effective channel length of the edge transistors relative to the length of the central conduction channel of the FET. Other methods of changing the work function $\Phi_{MF}$ of the gate structure overlying the edge transistors are also disclosed. The methods may be adapted to fabricating pFETs by reversing or substituting material types.

21 Claims, 10 Drawing Sheets

Related U.S. Application Data division of application No. 15/616,811, filed on Jun. 7, 2017, now Pat. No. 10,115,787.

(51) Int. Cl.
    *H01L 29/78*     (2006.01)
    *H01L 29/49*     (2006.01)
    *H01L 29/66*     (2006.01)
    *H01L 29/36*     (2006.01)
    *H01L 29/423*     (2006.01)
    *H01L 29/10*     (2006.01)

(52) U.S. Cl.
    CPC .......... *H01L 29/1041* (2013.01); *H01L 29/36* (2013.01); *H01L 29/4238* (2013.01); *H01L 29/42372* (2013.01); *H01L 29/4916* (2013.01); *H01L 29/4975* (2013.01); *H01L 29/66545* (2013.01); *H01L 29/78* (2013.01)

(56) References Cited

U.S. PATENT DOCUMENTS

| | | | |
|---|---|---|---|
| 7,910,993 | B2 | 3/2011 | Brindle |
| 10,115,787 | B1 * | 10/2018 | Paul .................... H01L 29/0607 |
| 10,756,166 | B2 | 8/2020 | Paul et al. |
| 2003/0230772 | A1 | 12/2003 | Fukuda |
| 2010/0197128 | A1 | 8/2010 | Schaeffer et al. |
| 2018/0366542 | A1 | 12/2018 | Paul et al. |

OTHER PUBLICATIONS

Pham, Long, Office Action received from the USPTO dated Feb. 9, 2018 for U.S. Appl. No. 15/616,811, 18 pgs.

Pham, Long, Notice of Allowance received from the USPTO dated Jun. 4, 2018 for U.S. Appl. No. 15/616,811, 5 pgs.

Pham, Long, Response to Rule 312 Communication received from the USPTO dated Jul. 12, 2018 for U.S. Appl. No. 15/616,811, 3 pgs.

Pham, Long, Notice of Allowability received from the USPTO dated Aug. 6, 2018 for U.S. Appl. No. 15/616,811, 2 pgs.

Paul, et al., Response filed in the USPTO dated Nov. 17, 2017 for U.S. Appl. No. 15/616,811, 8 pgs.

Paul, et al., Response filed in the USPTO dated Mar. 9, 2018 for U.S. Appl. No. 15/616,811, 11 pgs.

Paul, et al., Amendment After Allowance filed in the USPTO dated Jun. 27, 18 for U.S. Appl. No. 15/616,811, 8 pgs.

Nesso, Stefano, International Search Report and Written Opinion received from the EPO dated Aug. 9, 2018 for appln. No. PCT/US2018/035503, 12 pgs.

Colinge, et al., "Improved LOCOS Isolation for Thin-Film SOI MOSFETs", 8030 Electronics Letters, IEE Stevenage, GB, vol. 32, No. 19, Sep. 12, 1996, pp. 1834-1835 (2 pgs.).

Pham, Long, Office Action received from the USPTO dated May 10, 2019 for U.S. Appl. No. 16/049,741, 8 pgs.

Pham, Long, Office Action received from the USPTO dated Oct. 3, 2019 for U.S. Appl. No. 16/049,741, 25 pgs.

Pham, Long, Notice of Allowance received from the USPTO dated Apr. 10, 2020 for U.S. Appl. No. 16/049,741, 7 pgs.

Nesso, Stefano, Written Opinion of the International Preliminary Examining Authority received from the EPO dated Apr. 12, 2019 for appln. No. PCT/US2018/035503, 8 pgs.

Nesso, Stefano, International Preliminary Report on Patetanbility received from the EPO dated for appln. No. PCT/US2018/035503, 7 pgs.

PSemi Corporation, Response filed in the USPTO dated Jul. 9, 2019 for U.S. Appl. No. 16/049,741, 7 pgs.

PSemi Corporation, Response filed in the USPTO dated Jan. 2, 2020 for U.S. Appl. No. 16/049,741, 10 pgs.

PSemi Corporation, Amendment After Allowance filed in the USPTO dated Jun. 26, 2020 for U.S. Appl. No. 16/049,741, 6 pgs.

* cited by examiner

LOW LEAKAGE FET

CROSS-REFERENCE TO RELATED APPLICATIONS—CLAIM OF PRIORITY

The present application is a continuation of U.S. application Ser. No. 16/049,741, filed Jul. 30, 2018, entitled "Low Leakage FET", which is herein incorporated by reference in its entirety. Application Ser. No. 16/049,741 is a divisional of U.S. application Ser. No. 15/616,811, filed Jun. 7, 2017, entitled "Low Leakage FET", now U.S. Pat. No. 10,115,787 issued Oct. 30, 2018, which is herein incorporated by reference in its entirety.

BACKGROUND

(1) Technical Field

This invention relates to integrated circuit field effect transistor (FET) designs, and more particularly to low-leakage field effect transistor designs.

(2) Background

In the fabrication of integrated circuit (IC) field effect transistors (FET), silicon-on-insulator (SOI) substrates have many benefits over bulk silicon substrates, including higher speed, lower power consumption, improved radio frequency (RF) performance, and improved radiation resistance. For many IC applications, dielectrically-isolated CMOS FETs are the preferred transistor and logic structure due to their scalability, low power, and design flexibility. In dielectrically-isolated CMOS, N-type and P-type MOSFETs are isolated laterally from each other by fabricating each one in its own silicon island. Typically, this isolation is provided by etching the silicon film of an SOI substrate into spaced-apart islands and backfilling the gaps between such islands with deposited silicon dioxide ($SiO_2$), although in the early days of SOI, isolation through local oxidation of the silicon regions between transistors (also known as LOCOS isolation) had been widely used.

FIG. 1 is a top plan view of the layout of a typical prior art N-type MOSFET ("nFET") 100 fabricated on SOI. An island of P-type silicon 102 is formed in conventional fashion (e.g., by diffusion of boron) on an SOI substrate, and surrounded by $SiO_2$ 104 by backfilling or LOCOS isolation. A gate structure 106, having a length L, comprising an insulator (e.g., an oxide layer) and overlaying gate material (e.g., polysilicon) is formed over the silicon island 102. N-type source 108 and drain 110 regions are formed by implanting or diffusing N+ material (e.g., phosphorus, arsenic) within a masked implant area 111, over the silicon island 102 (note that the masked implant area 111 used to define the source 108 and drain 110 N+ implant regions overlaps the $SiO_2$ surrounding the silicon island 102). Accordingly, the gate structure 106 is self-aligned with respect to the source 108 and drain 110 regions and defines a conduction channel 113 between the source 108 and drain 110 regions. Electrically conductive contacts 112, 114 are respectively made to the source 108 and drain 110 regions. Other common structures (e.g., device interconnects, gate contacts, etc.) are omitted for clarity.

The $SiO_2$ backfilling and LOCOS isolation techniques, as well as similar processes, leave the two opposing width-wise edges 116 (indicated by the bold lines within the reference ovals 118) of the nFET conduction channel 113 in contact with $SiO_2$ (the width of the nFET 100 is perpendicular to the length L and in the plane of the SOI substrate). During IC fabrication processing for the nFET 100, boron implanted within the P-type silicon island 102 under the gate structure 106 (i.e., within the FET conduction channel 113) segregates from the silicon at the edges 116 of the nFET conduction channel 113 into the adjacent $SiO_2$ 104. Segregation causes the boron concentration in the silicon at the edges 116 of the FET to be lower than in the central region of the conduction channel 113 (the central region is approximately encompassed by the dotted-line reference box 120). As is known, the boron depletion at the edges 116 of an nFET 100 results in a reduction of threshold voltage at the channel edge due to the band gap at the edges 116 being bent downward, typically by several tenths of a volt (for reference, the bandgap of silicon is about 1 V). Drain leakage current, $Id_{OFF}$, increases approximately at the rate of a decade of current for every 67 mV of band bending. Hence boron depletion at the edges 116 of an nFET 100 may cause the leakage current at the edges 116 to increase by multiple orders of magnitude as compared to a flat profile with no boron depletion.

This phenomenon has been known since the earliest utilization of SOI for substrates, and results in a lower threshold voltage, Vt, at the edges 116 of the nFET 100—so-called "edge transistors"—thereby increasing leakage current (especially since there are typically two edges per transistor, as shown in FIG. 1). Indeed, from this perspective, the nFET 100 may be modeled as three parallel transistors, a central conduction channel transistor having a threshold voltage $Vt_C$, and two edge transistors having lower threshold voltages $Vt_E$. Due to their lower $Vt_E$, the two edge transistors begin conducting before the $Vt_C$ of the central conduction channel transistor is reached, resulting in increased leakage at the edges. This edge leakage often dominates the total leakage of each nFET, which in turn can increase standby power consumption of such FETs by an order of magnitude or more and thus increase overall power consumption of any systems using such nFETs. This edge leakage problem may also be seen in PMOSFETs ("pFETs") fabricated on thin SOI substrates.

While the extent of the edge transistors of an nFET involves the length of the gate structure at the edges 116 of the nFET 100 and doping concentrations along that length and permeating to an extent about the width (i.e., laterally) and depth of the nFET at those edges, it is convenient to refer to just the edges 116 as being the edge transistors. Thus, for purposes of this disclosure, the edges 116 indicated by bold lines in FIG. 1 can be considered as defining the edge transistors of the illustrated nFET 100 unless otherwise characterized.

Attempts have been made to reduce edge transistor leakage by increasing the length of the gate structure 106 at the edge transistors 116 of an nFET 100, thus lengthening the corresponding edge transistors of the nFET 100 relative to the length L of the center region of the nFET 100, and/or by setting back the edge transistors 116 of the main channel from the silicon island 102. However, these approaches have numerous disadvantages, including insufficient reduction in leakage current, some increase in area and total gate capacitance, and a reduction in drive current $I_{ON}$, especially in minimum width transistors.

Accordingly, there is a need for a low-leakage FET design, and in particular for an nFET fabricated on SOI that exhibits low leakage in the presence of the edge transistor phenomenon described above.

SUMMARY

The present invention encompasses FET designs, and in particular NMOSFET ("nFET") designs fabricated on SOI, that exhibit low leakage in the presence of the edge transistor phenomenon. Embodiments of the invention include nFET designs in which the Vt of the edge transistors ($Vt_E$) is increased by changing the work function of the gate structure overlying the edge transistors. To describe embodiments of the invention, a polysilicon gate structure is used as an example, but other gate materials may be used and other threshold-shifting techniques may be used to implement the invention. More specifically, some embodiments of the invention increase the work function of the gate structure overlying the edge transistors of an nFET by forming extra P+ implant regions within at least a portion of the gate polysilicon structure overlying the edge transistors, thereby increasing the Vt of the edge transistors to a level that is at least equal to, and may exceed, the Vt of the central conduction channel of the nFET.

In variant embodiments, the work function of the gate structure overlying the edge transistors of an nFET may be increased by: creating a hybrid polysilicon/metallic gate structure, with polysilicon in the central region and a metal or metal-like material over the edge regions of the gate structure; creating a gate structure with two different metals or metal-like materials in the central and edge regions of the gate structure; creating a gate structure co-doped with both N+ and P+ dopants to create degeneratively-doped polysilicon over the edge regions of the gate structure such that the work function differs between the central and edge regions of the gate structure; and doping the insulator beneath the gate structure such that the work function differs between the central and edge regions of the gate structure.

In addition, in some of the embodiments, the gate structure of the nFET is also modified to increase or "flare" the effective channel length of the edge transistors relative to the length of the central conduction channel of the FET. The increased edge transistor channel length results in a further reduction of leakage current, in addition to the decreased leakage current from the work function modification that more closely approximates the leakage current, $Id_{OFF}$, of the central conduction channel of the nFET.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Overview

Figure 1:
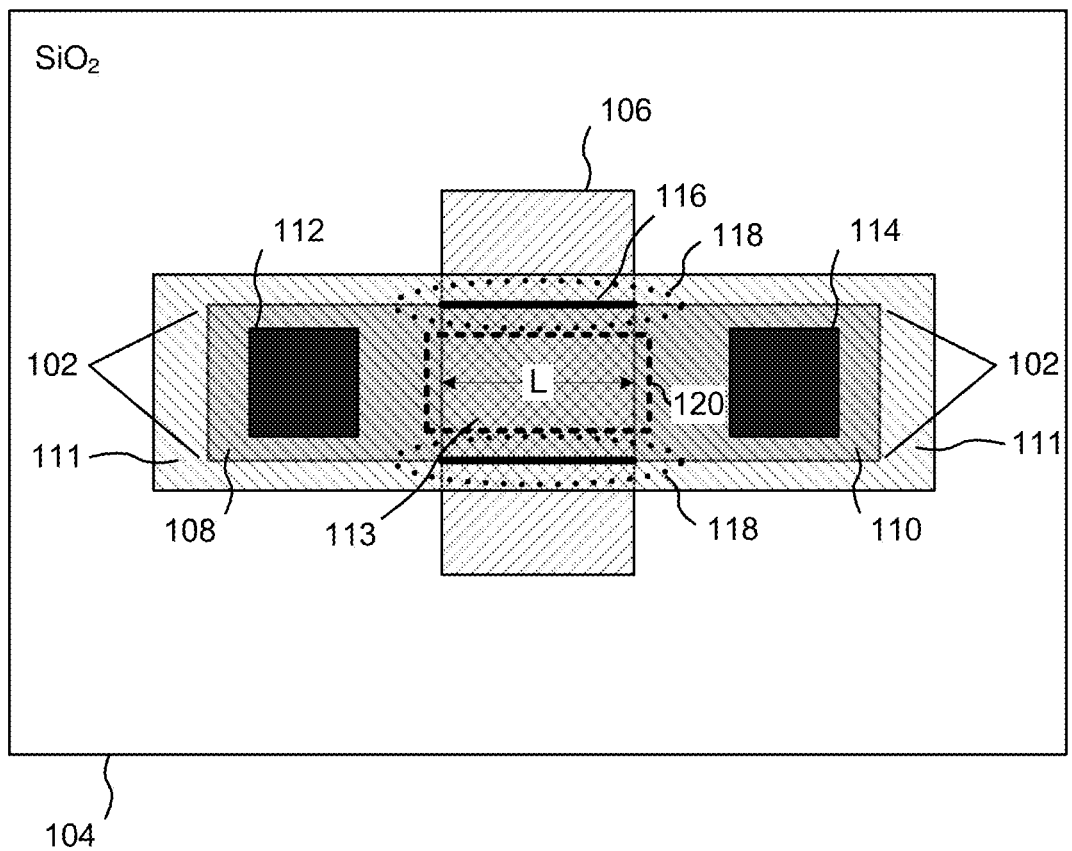
FIG. 1 is a top plan view of the layout of a typical prior art N-type MOSFET ("nFET") fabricated on SOI.

The present invention encompasses FET designs, and in particular NMOSFET ("nFET") designs fabricated on SOI, that exhibit low leakage in the presence of the edge transistor phenomenon. Embodiments of the invention include nFET designs in which the Vt of the edge transistors is increased by changing the work function of the gate structure overlying the edge transistors. To describe embodiments of the invention, a polysilicon gate structure is used as an example, but other gate materials may be used and other threshold-shifting techniques may be used to implement the invention. More specifically, some embodiments of the invention increase the work function of the gate structure overlying the edge transistors of an nFET by forming extra P+ implant regions within at least a portion of the gate polysilicon structure overlying the edge transistors, thereby increasing the Vt of the edge transistors ($Vt_E$) to a level that is at least equal to, and may exceed, the Vt of the central conduction channel ($Vt_C$) of the nFET.

As is known in the art, the Vt of an nFET is determined by several principal factors, the most significant of which are the channel doping concentration $N_A$, the work function $\Phi_{MF}$ of the gate structure, and the gate oxide thickness $t_{OX}$. Increasing any of $\Phi_{MF}$, $N_A$, or $t_{OX}$ increases Vt. However, changing the channel doping concentration $N_A$ and the gate oxide thickness $t_{OX}$ can affect other performance design parameters of an nFET, particularly the saturation drain current Idsat, which has a strong impact on circuit speed for digital and analog transistors. Accordingly, embodiments of the invention increase the $\Phi_{MF}$ of the gate structure overlying the edge transistors of an nFET, preferably by forming extra P+ implant regions within at least a portion of the gate structure overlying the edge transistors, thereby increasing the threshold voltage, $Vt_E$, of the edge transistors.

Variant embodiments of such nFET designs also "flare" the gate structure overlying the edge transistors to increase the effective channel length of the edge transistor relative to the length of the central conduction channel of the nFET. The increased edge transistor channel length results in a further reduction of leakage current, in addition to the decreased leakage current from the gate work function modification that more closely approximates the leakage current, $Id_{OFF}$, of the central conduction channel of the nFET.

The figures of this disclosure described below show enhancement-mode nFETs in which the source and drain regions are N+, the conduction channel is P-type, the gate structure is N+ polysilicon (preferably with a silicide layer to reduce gate resistance), and a body tie, if present, has a P+ contact region to make contact to a P-type body tie connection to the floating P-type body of the NMOSFET. However, the teachings of the invention may be applicable to pFETs and to depletion-mode FETs in some applications. For example, fabricating ICs using thin silicon-on-insulator substrates may cause pFETs to leak at their edge transistors; the methods described below may be used to make low leakage pFETs by reversing the doping (e.g., N+ implant over polysilicon gate structure). Accordingly, the illustrated embodiments and example materials should not be taken as limitations on the scope of the invention.

By way of further background, details of several methods of FET fabrication are set forth in U.S. Pat. No. 5,863,823, issued Jan. 26, 1999, entitled "Self-Aligned Edge Control in Silicon on Insulator", assigned to the assignee of the present invention, the contents of which are hereby incorporated by reference.

Example Embodiment—$\Phi_{MF}$ Modification

Figure 2A:
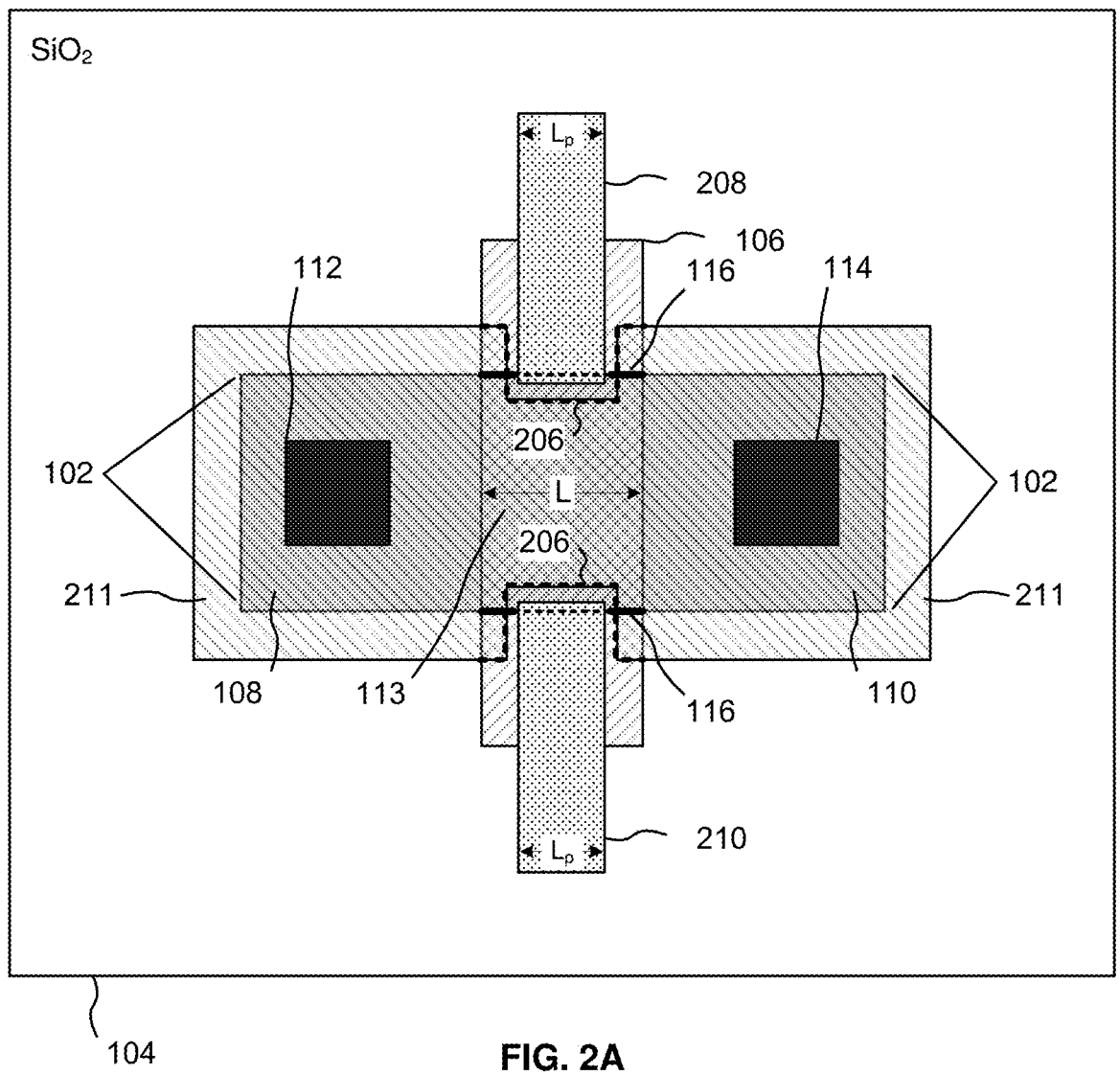
FIG. 2A is a top plan view of the layout of a first embodiment of an nFET fabricated on SOI and doped with extra P+ implant regions.
Figure 2B:
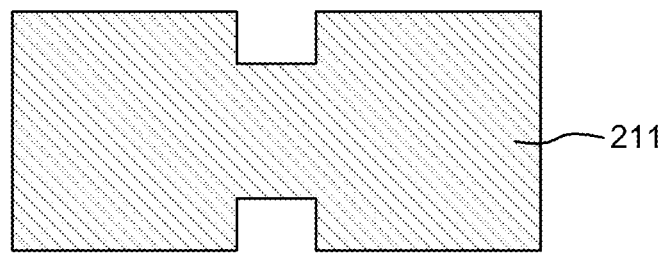
FIG. 2B is a top plan view of the layout of the masked implant area (reduced in size) for the embodiment of FIG. 2A.

FIG. 2A is a top plan view of the layout of a first embodiment of an nFET 200 fabricated on SOI and doped with extra P+ implant regions. As in FIG. 1, an island of P-type silicon 102 is formed in conventional fashion (e.g., by diffusion of boron) on an SOI substrate, and surrounded by SiO$_2$ 104 (e.g., by backfilling or LOCOS isolation). A gate structure 106 comprising an insulator (e.g., an oxide layer) and overlaying gate material (e.g., polysilicon) is formed over the silicon island 102. N-type source 108 and drain 110 regions are formed by conventional means within a masked implant area 211 overlapping the silicon island 102. FIG. 2B is a top plan view of the layout of the masked implant area 211 (reduced in size) for the embodiment of FIG. 2A.

The gate structure 106 is self-aligned with respect to the source 108 and drain 110 regions and defines a conduction channel 113 between the source 108 and drain 110 regions. Electrically conductive contacts 112, 114 are respectively made to the source 108 and drain 110 regions. Other common structures (e.g., device interconnects, gate contacts, etc.) are omitted for clarity. As is known in the art, additional steps may be taken to create features and structures for particular applications (e.g., halo regions to control or shape the extent of depletion regions, lightly doped drain (LDD) regions, offset spacers, etc.), and each individual nFET 200 would commonly be connected to other active and passive circuit elements on the same substrate. See also FIGS. 5A-5E for views of an example fabrication sequence for the nFET 200 of FIG. 2A.

As should be clear by comparing FIG. 1 to FIG. 2A, and particularly FIG. 2B, the masked implant area 211 used to define the source 108 and drain 110 N+ implant regions of the nFET 200 of FIG. 2A differs in shape from the rectangular masked implant area 111 used to define the source 108 and drain 110 N+ implant regions of the nFET 100 of FIG. 1. More particularly, the edges of the masked implant area 211 for FIG. 2A are notched on two sides over the edge transistors 116, as indicated by dashed bold lines 206, so as to avoid implanting N+ material over most or all of the edge transistors 116 of the nFET 200; the notches are readily apparent in FIG. 2B.

An important aspect of the invention is that the gate structure 106 overlying the edge transistors 116 is altered to increase the Vt of the edge transistors by changing the work function of portions of the gate structure 106. More particularly, extra P+ implant regions 208, 210 are formed within at least a portion of the gate structure 106 and over a portion of the edge transistors 116 (the portion being shown as a dotted line). The P+ implant regions 208, 210 are generally configured to only affect the portion of the gate structure 106 over the edge transistors 116, and not the central portion of the gate structure 106. As indicated, the length $L_P$ of the P+ implant regions 208, 210 generally should be less than or equal to the length L at the center of the gate structure 106 to avoid implantation of P+ dopant into the source 108 and drain 110 regions of the nFET 200. Keeping $L_P$<L provides alignment buffer regions on both sides of the P+ implant regions 208, 210. It should be appreciated that P+ implant regions 208, 210 become an integral part of the gate structure 106, and are not simply an added layer of material.

In variant embodiments, the P+ implant regions 208, 210 may overlap the N+ implant regions for the source 108 and drain 110. Such an overlap will form degenerately-doped polysilicon within part of the gate structure 106; however, such a structure would still have a higher threshold voltage than pure N+ regions. Such a configuration may be useful where alignment tolerances are such that some nFET devices may have N+/P+ overlap regions.

By forming the P+ implant regions 208, 210 within at least a portion of the gate structure 106 over a portion of the edge transistors 116, the $\Phi_{MF}$ of the implanted portion of the gate structure 106 is increased. As a person of ordinary skill will understand, the amount of P+ doping may be selected (for example, by modeling and/or experimentation) to cause the $Vt_E$ of the edge transistors 116 to match or exceed the $Vt_C$ of the central conduction channel of the nFET 200.

With the P+ implant regions 208, 210 formed within at least a portion of the gate structure 106, the work function $\Phi_{MF}$ of the gate structure 106 may be increased by many tenths of a volt, and often by more than about 0.5 V. This increase in $\Phi_{MF}$ may raise the $Vt_E$ of the P+ implanted portions of the gate structure 106 over the edge transistors 116 by an amount at least equal to $\Phi_{MF}$. Depending on the $Vt_C$ of the central conduction channel transistor of the nFET 200 and the level of P+ doping in the implant regions 208, 210, the $Vt_E$ in the P+ implanted portions of the gate structure 106 over the edge transistors 116 may raise to a level at or even above the $Vt_C$ of the central portion of the gate structure 106, thereby ensuring that the edge transistor standby current leakage will be equal to or significantly reduced as compared to the center channel region and to the prior art.

In CMOS embodiments, the P+ implant in the implant regions 208, 210 for each nFET 200 may occur during the normal P+ implant for complementary pFET source and drain regions. Accordingly, there are no additional fabrication steps required to make the nFET 200; instead, a new P+ mask that includes defined P+ implant regions 208, 210 is substituted for an existing P+ implant mask lacking such regions.

Further, as described in greater detail below, simply by changing the geometry of the P+ implant mask, different levels of leakage drain current, $Id_{OFF}$, can be achieved with a single basic nFET design.

Example Embodiment—$\Phi_{MF}$ Modification & Gate Edge Flaring

Variant embodiments of nFET designs in accordance with the present invention may also flare the gate structure overlying the edge transistors of the nFET in addition to utilizing P+ implant in the implant regions. Flaring the gate structure increases the effective channel length of the edge transistors relative to the length of the central conduction channel of the FET. The increased edge transistor channel length further reduces the leakage of the nFET. Flaring the gate edge also has the advantage of easier alignment of the P+ implant mask to the gate, considering that the gate length is often the smallest dimension on an integrated circuit. A person of ordinary skill in the art will understand that the flared region will increase gate capacitance, thereby slowing the transistor, and that there is an inherent tradeoff between lowering the leakage current and increasing the gate capacitance.

Figure 3:
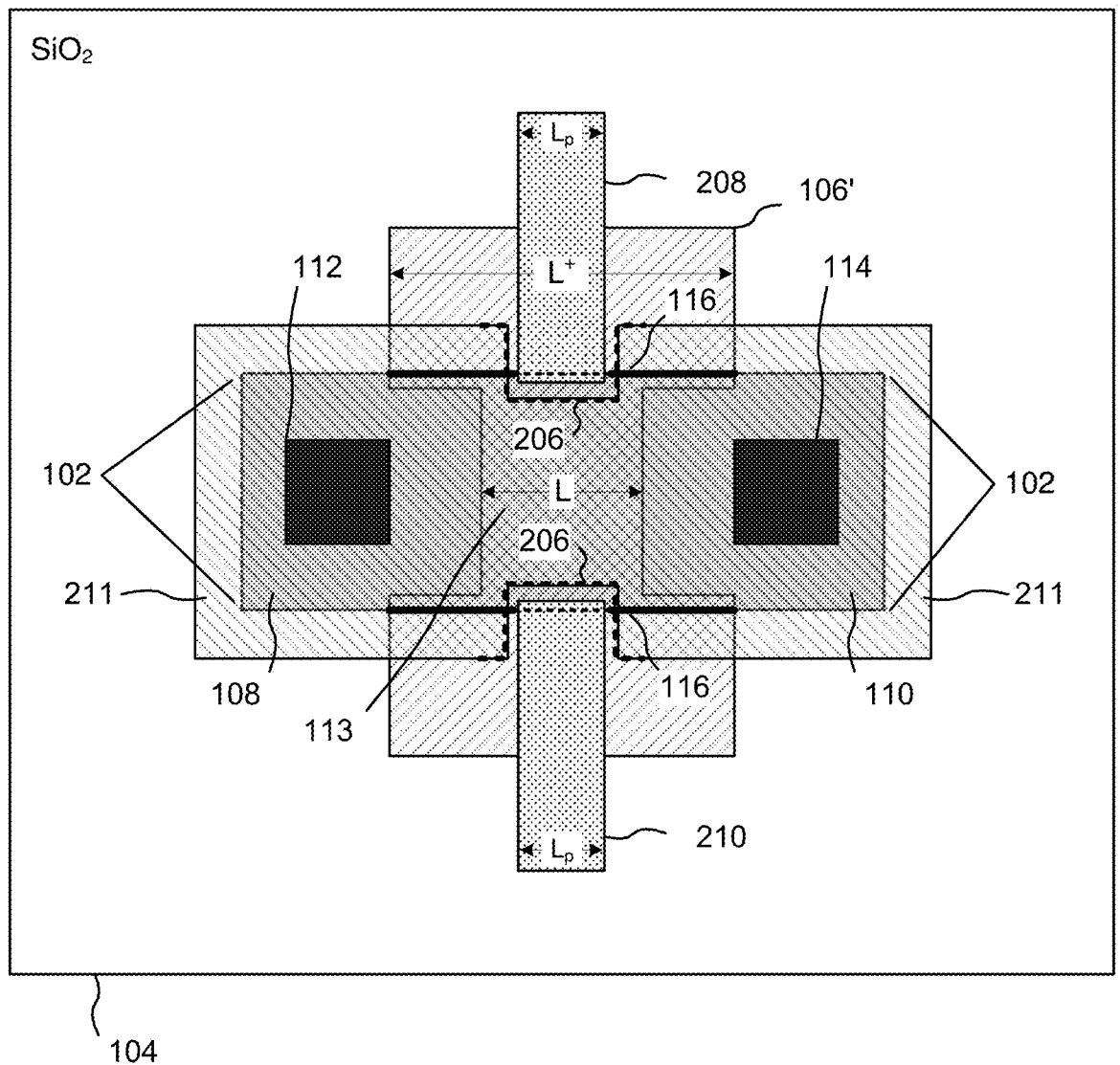
FIG. 3 is a top plan view of the layout of a second embodiment of an nFET fabricated on SOI and doped with extra P+ implant regions.

FIG. 3 is a top plan view of the layout of a second embodiment of an nFET 300 fabricated on SOI and doped with extra P+ implant regions. The order, structure, and function of each region is the same as the nFET 200 of FIG. 2A, except that the gate structure 106' is flared relative to the length L of the gate structure 106' over the central conduction channel 113 of the nFET 300. That is, the gate structure 106' is lengthened to L$^+$ from L, thus increasing the length of the edge transistors 116, as indicated by the bold lines (the portion of the edge transistors 116 over which the P+ implant regions 208, 210 are formed is shown as a dotted line).

Modification of $\Phi_{MF}$ for the gate structure 106' overlying the edge transistors 116 and use of a flared gate structure 106' over the edge transistors 116 can be applied to nFETs having a long or a short central channel length. In longer channel devices, virtually no extra IC area may be required since the gate structure 106' is generally long enough to accommodate the P+ implant regions 208, 210 plus adjacent alignment buffer regions. In other words, when the gate length L is greater than or equal to ($L_P$+2δ), where δ is an alignment margin, then no added edge flare of the gate structure is needed for the P+ implant regions 208, 210, as in FIG. 2A. In an nFET with a shorter central conduction channel (i.e., shorter center gate length L), flaring the edge of the gate structure to have a length L$^+$ greater than or equal to ($L_P$+2) will accommodate the P+ implant regions 208, 210 plus adjacent alignment buffer regions. In the latter case, the excess area consumed by the edge flare is generally relatively small.

Example Embodiment—$\Phi_{MF}$ Modification & Triangular Gate Edge Flaring

Figure 4A:
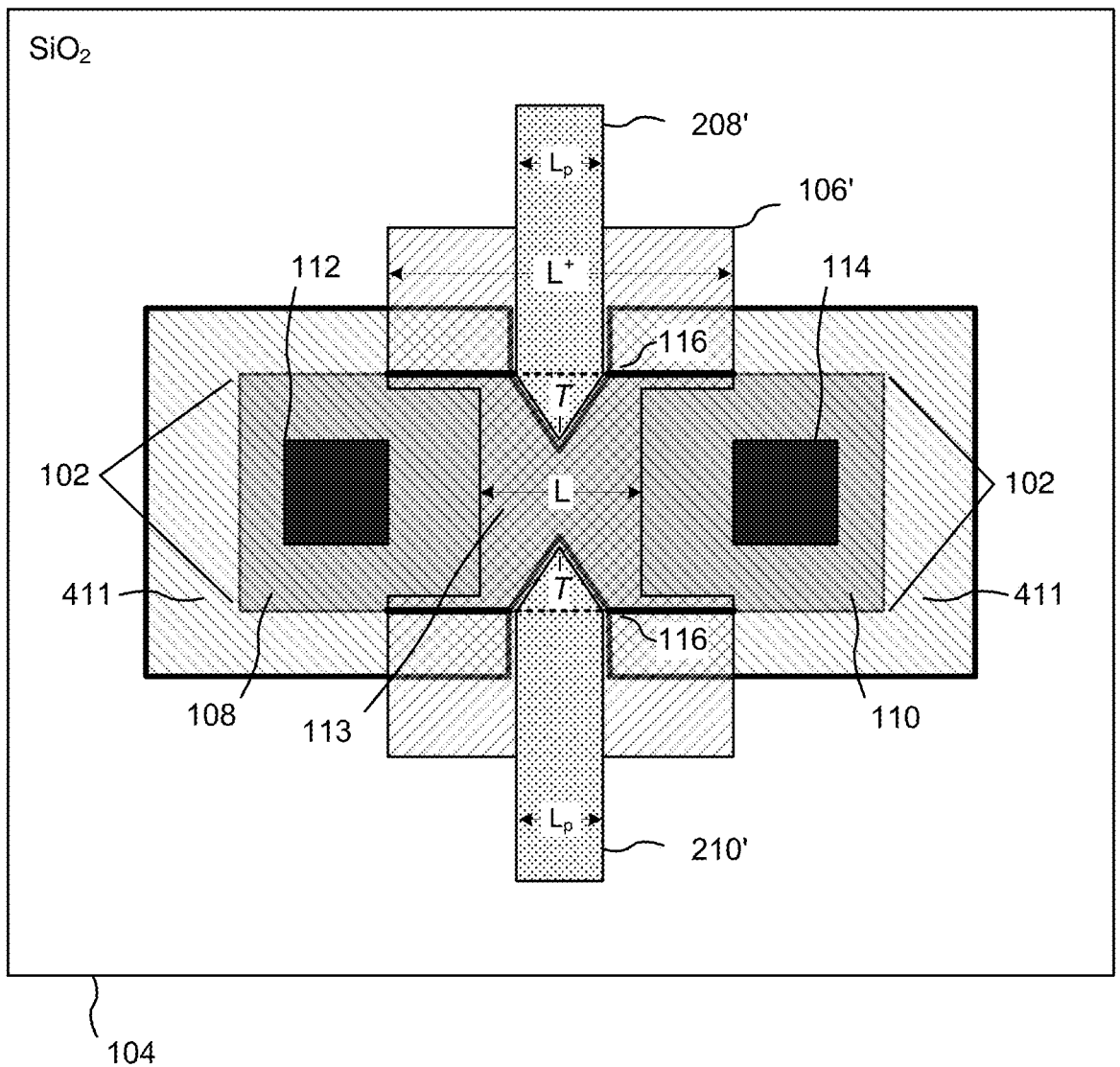
FIG. 4A is a top plan view of the layout of a third embodiment of an nFET fabricated on SOI and doped with extra P+ implant regions.
Figure 4B:
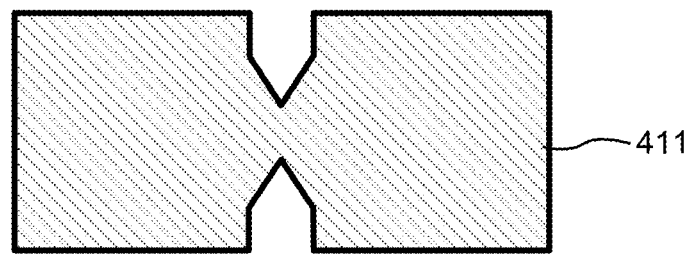
FIG. 4B is a top plan view of the layout of the masked implant area (reduced in size) for the embodiment of FIG. 4A.

FIG. 4A is a top plan view of the layout of a third embodiment of an nFET 400 fabricated on SOI and doped with extra P+ implant regions. The order, structure, and function of each region is the same as in FIG. 3 (including flared gate structure 106'), except that the masked implant area 411 used to define the source 108 and drain 110 N+ implant regions is notched on two sides in a triangular shape over the edge transistors 116, so as to avoid implanting N+ material over some extent of the edge transistors 116 of the nFET 400. FIG. 4B is a top plan view of the layout of the masked implant area 411 (reduced in size) for the embodiment of FIG. 4A; the notches are readily apparent in FIG. 4B.

The P+ implant regions 208', 210' are similarly formed with a matching triangular shape at one end within at least a portion of the gate structure 106' and over a portion of the edge transistors 116. In addition, using a flared gate structure 106' keeps the P+ implant away from the source 108 and drain 110 of the main transistor (for most embodiments, an object is to modify only the work function of the edge transistor using a P+ implant without impacting the source 108 and drain 110 regions of the nFET 400, which require an N+ implant). Accordingly, in the illustrated example, the masked implant area 411 for the source/drain N+ implant regions approximately conforms to the shape of the P+ implant region within the edge portions of the gate structure 106' (as should be recognized, some tolerance for alignment errors may be necessary, and hence the two shapes may not exactly conform to each other). Note that the flared gate structure 106' itself is not notched. See also FIGS. 6A-6E for views of an example fabrication sequence for the nFET of FIG. 4A.

The triangular-shaped termination for the P+ implant regions 208', 210' ensures that the high $Vt_E$ region of the modified gate structure penetrates well into the edge transistors 116 while minimizing any impact on saturation current or $R_{ON}$. A further advantage of the triangular-tipped P+ implant regions 208', 210' in FIG. 4A is that they provide a gradient for the $Vt_E$ of the edge transistors 116. As noted above, while the edge transistors 116 are depicted as lines, they have an extent that involves doping concentrations along those lines and permeating to an extent about the width (i.e., laterally) and depth of the edges of the nFET. Thus, at the tip T of each P+ implant region 208', 210', the increase in $Vt_E$ due to alteration of the $\Phi_{MF}$ of the underlying gate structure 106' is less than at increasingly wider points further away from T within the P+ implant regions 208', 210'. Accordingly, additional degrees of design freedom may be achieved by controlling the geometry of the implant area 411 mask used to define the source and drain N+ implant regions with respect to the edge transistors 116, as well as the geometry of the mask defining the P+ implant regions.

More particularly, by changing the geometry of the P+ implant mask, different levels of leakage drain leakage current, $Id_{OFF}$, can be achieved with a single basic nFET design. To first order, there are two factors that are involved. First, the P+ implant dose in the implant regions 208', 210' will set the $Vt_E$ of the edge transistors 116. However, the lateral penetration of the edge transistors 116 is another effect to be considered. Since boron depletion is a diffusion process, the greatest $Vt_E$ shift is at the edge of the edge transistors 116, but drops exponentially going inward toward the inner ($Vt_C$) region of the central conduction channel of the nFET 200. The triangular P+ implant shape shown in FIG. 4A works both because the P+ implant is actually overcompensating the inner region (because of less boron depletion in the channel) and because the length L of the edge transistors 116 can be shorter toward the inner region because the boron depletion is less. Second, the resulting leakage current is set by both the $Vt_E$ of the edge transistors 116 and the length of the edge transistors 16 (transistor currents are proportional to width/length). The benefit provided by changing $Vt_E$ is an exponential factor, while the benefit provided by changing L is a linear factor. While altering the geometry of the P+ implant mask does not change $Vt_E$ (which is altered by the implant itself), altering the geometry of the P+ implant mask does change the leakage current as a function of $Vt_E$ and L.

While the examples of FIGS. 2-4 are of notched implant area 411 masks having conformingly-shaped P+ implant regions 208, 208', 210, 210', the shapes need not match. For example, an implant area 411 mask may be notched to have (by way of example only) a saw-tooth or square-tooth shape, while the inner ends of the P+ implant regions may be shaped as a square or a triangle or some other shape, and vice versa.

Example Fabrication Sequences

Figure 5A:
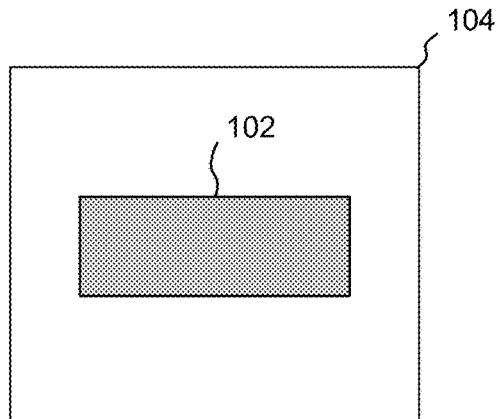
FIGS. 5A-5E are top plan views of an example fabrication sequence for the nFET of FIG. 2A.
Figure 5D:
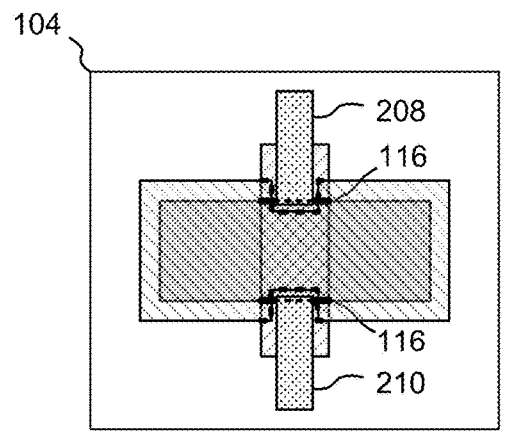
Figure 5B:
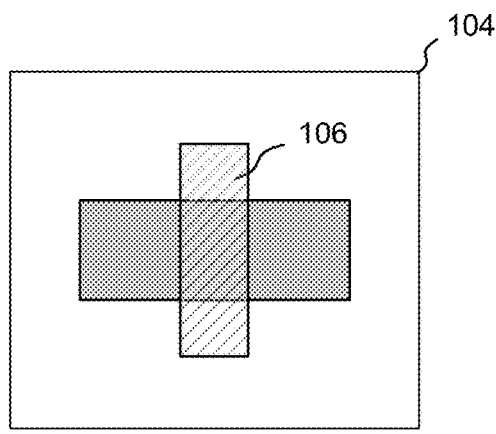
Figure 5E:
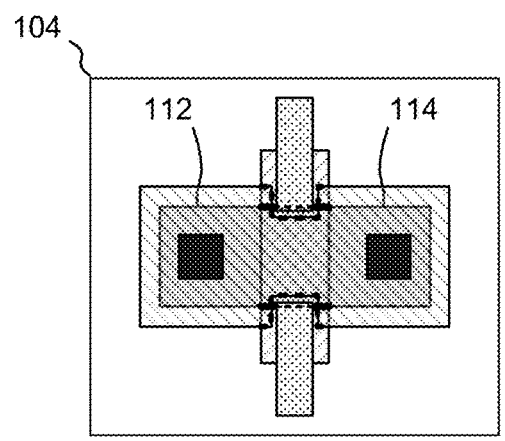
Figure 5C:
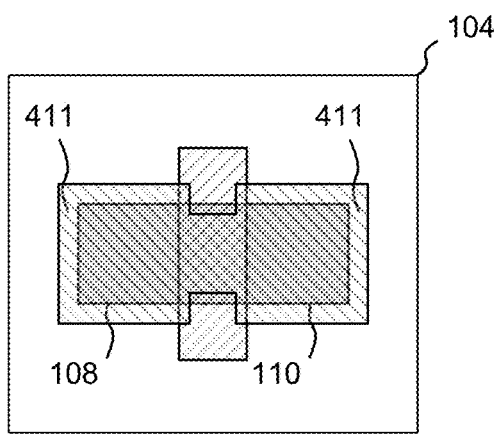

FIGS. 5A-5E are top plan views of an example fabrication sequence for the nFET 200 of FIG. 2A (for added clarity, some reference numbers are not repeated in successive figures). In FIG. 5A, an island of P-type silicon 102 is formed on an SOI substrate (not separately shown) and surrounded by $SiO_2$ 104. In FIG. 5B, a gate structure 106 is formed over the silicon island 102 to define a central conduction channel and two edge transistors. In FIG. 5C, a masked implant area 411 is used to implant N+ dopant in source 108 and drain 110 regions by aligning the mask for the implant area 411 over the silicon island 102. As shown, the masked implant area 411 for the source/drain regions is notched in a square shape over a portion of the edge transistors defined by the gate structure 106. In FIG. 5D, P+ implant regions 208, 210 are formed with a matching square shape at one end conforming to the corresponding notch of the masked implant area 411. The P+ implant regions 208, 210 overlap at least a portion of the gate structure 106 and over a portion of the edge transistors 116. In FIG. 5E, electrically conductive contacts 112, 114 are respectively made to the source 108 and drain 110 regions.

Figure 6A:
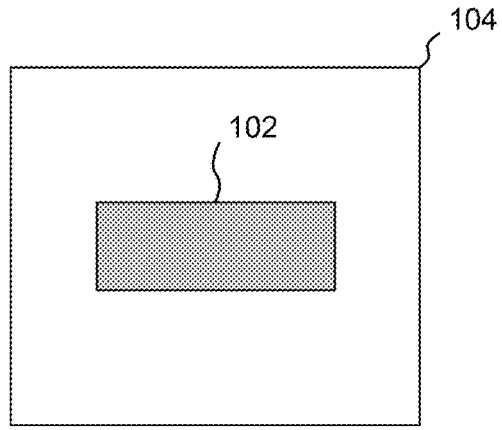
FIGS. 6A-6E are top plan views of an example fabrication sequence for the nFET of FIG. 4A.
Figure 6D:
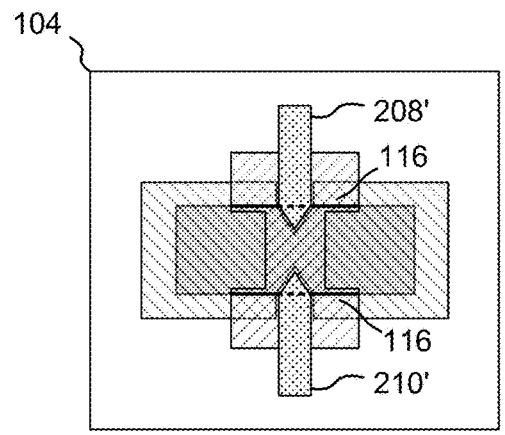
Figure 6B:
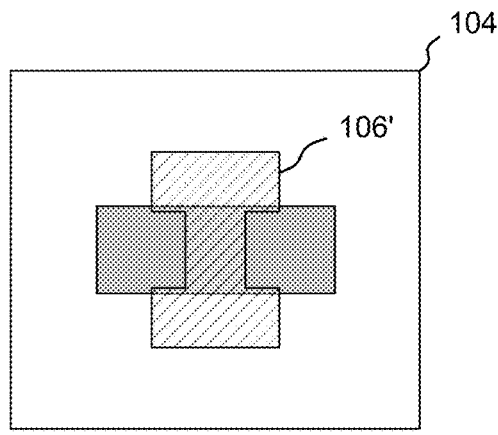
Figure 6E:
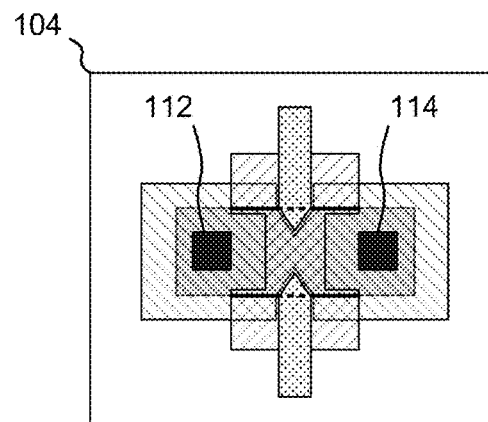
Figure 6C:
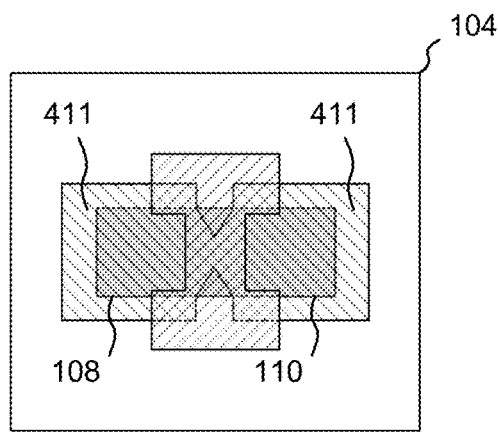

FIGS. 6A-6E are top plan views of an example fabrication sequence for the nFET 400 of FIG. 4A (for added clarity, some reference numbers are not repeated in successive figures). In FIG. 6A, an island of P-type silicon 102 is formed on an SOI substrate (not separately shown) and surrounded by $SiO_2$ 104. In FIG. 6B, a flared gate structure 106' is formed over the silicon island 102 to define a central conduction channel and two edge transistors. In FIG. 6C, a masked implant area 411 is used to implant N+ dopant in source 108 and drain 110 regions by aligning the mask for the implant area 411 over the silicon island 102. As shown, the masked implant area 411 for the source/drain regions is notched in a triangular shape over a portion of the edge transistors defined by the gate structure 106'. In FIG. 6D, P+ implant regions 208', 210' are formed with a matching triangular shape at one end conforming to the corresponding notch of the masked implant area 411. The P+ implant regions 208', 210' overlap at least a portion of the gate structure 106' and over a portion of the edge transistors 116. In FIG. 6E, electrically conductive contacts 112, 114 are respectively made to the source 108 and drain 110 regions. A similar sequence of steps may be used to fabricate the nFET layout shown in FIG. 3.

As one of ordinary skill in the art will appreciate, other common structures (e.g., device interconnects, gate contacts, etc.) are omitted for clarity, and other or additional steps may be involved in the formation of the structures depicted in FIGS. 2, 3, 4, 5A-5E, and 6A-6E. Further, some of the steps described above may be performed in an order different from that described.

Alternative Embodiments and Benefits

Figure 7:
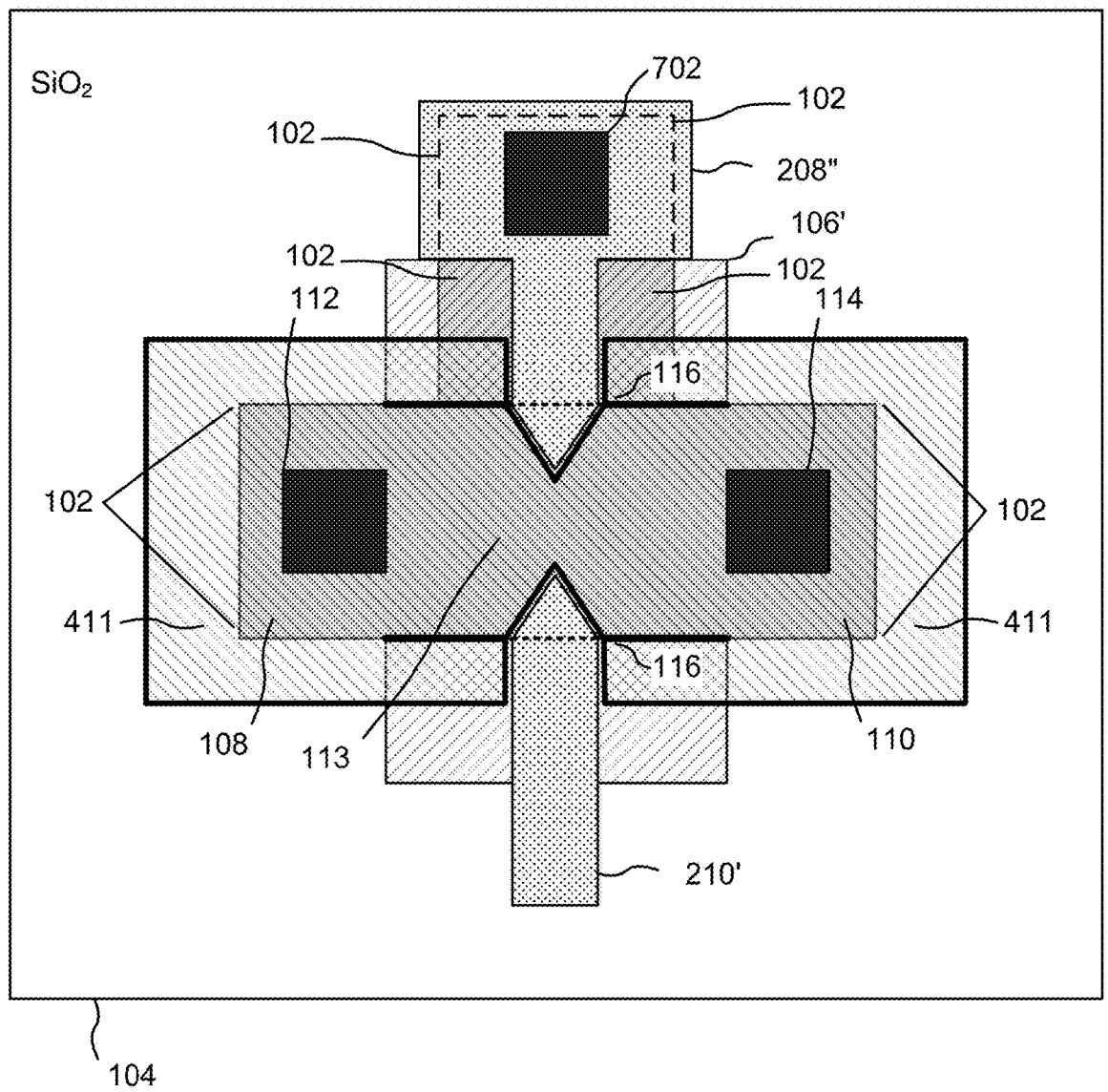
FIG. 7 is a top plan view of the layout of a forth embodiment of an nFET fabricated on SOI, doped with extra P+ implant regions, and configured for a body tie.

A person of ordinary skill in the art of FET fabrication will understand that many possible layout options exist beyond those illustrated in FIGS. 2-4. For example, FIG. 7 is a top plan view of the layout of a fourth embodiment of an nFET 700 fabricated on SOI, doped with extra P+ implant regions, and configured for a body tie. The illustrated embodiment is similar to FIG. 4A, except that the silicon island 102 extends beyond the gate structure 106' at the top of the drawing (as indicated in part by dashed lines, since the silicon island is beneath the P+ implant region 208"), and the P+ implant region 208" is shaped (as a "T" shape, in this embodiment) to facilitate formation of a gate or source body tie connection (e.g., a direct connection or a diode, not shown), for example, by using a conductive interconnect (e.g., metal) in another layer of the nFET 700 structure (not shown). A gate-body tie may be made by adding a conductive interconnect between a contact region 702 within the P+ implant region 208" and a contact (not shown) within the gate structure 106'. A source-body tie may be made by adding a conductive interconnect between the contact region 702 within the P+ implant region 208" and the electrically conductive contact 112 for the source 108 (noting that the labeling of source 108 and drain 110 is essentially arbitrary, and the labels may be reversed). Body ties may alternatively be made between the contact region 702 and an external node for independent biasing. Optionally, the structure of the nFET 600 may include a similar "bottom" body tie connecting into a similarly-shaped variant of the opposite-side P+ implant region 210'.

Body ties are described, for example, in U.S. Pat. No. 7,890,891, issued Feb. 15, 2011, entitled "Method and Apparatus Improving Gate Oxide Reliability by Controlling Accumulated Charge" and in U.S. Pat. No. 7,910,993, issued on Mar. 22, 2011, entitled "Method and Apparatus for Use in Improving Linearity of MOSFETS Using an Accumulated Charge Sink", both of which are assigned to the assignee of the present invention and hereby incorporated by reference. Inclusion of a body tie extension is an option that may be chosen for various beneficial reasons, especially in analog and mixed signal applications. Advantages of body ties may include improved output resistance, higher gain, and improved linearity, among others. However, a body tie might not be chosen for some digital applications, thereby saving area and potentially improving performance of the digital logic.

While implant regions formed within at least a portion of a FET gate structure and over a portion of the edge transistors of the FET are most often of benefit with nFETs, there may be cases where similar implant regions may be of benefit with pFETs by reversing the doping (e.g., N+ implant over the polysilicon gate structure of a PMOSFET). Accordingly, the invention is not limited to nFETs.

The current invention provides superior edge transistor control over existing approaches with minimal impact on area and gate capacitance. This is because the increase in $\Phi_{MF}$ for the gate structure portions overlaying the edge transistors can raise $Vt_E$ equal to or above that of the $Vt_C$ of the main transistor channel, while with previous approaches, it is more difficult to get $Vt_E$ to even approach $Vt_C$. Notably, increasing the length L+ of the edge transistors only reduces current linearly with L+; in contrast, increasing $Vt_E$ decreases leakage current exponentially. In addition, modifying $\Phi_{MF}$ for the gate structure above the edge transistors, rather than modifying the channel doping concentration $N_A$ and/or the gate oxide thickness $t_{OX}$, minimizes or eliminates effects on Idsat, thus avoiding conventional trade-offs between Idsat and $Vt_C$.

While the examples shown in FIGS. 2-4 have used P+ implant regions within at least a portion of the gate structure overlying the edge transistors to increasing the $\Phi_{MF}$ of the implanted portions, other techniques may be used for increasing the $\Phi_{MF}$ in those portions to increase $Vt_E$. For example, in variant embodiments, the work function of the gate structure overlying the edge transistors of an nFET may be increased by: creating a hybrid polysilicon/metallic gate structure, with polysilicon in the central region and a metal or metal-like material over the edge regions of the gate structure; creating a gate structure with two different metals or metal-like materials in the central and edge regions of the gate structure; creating a gate structure co-doped with both N+ and P+ dopants to create degeneratively-doped polysilicon over the edge regions of the gate structure such that the work function differs between the central and edge regions of the gate structure; and doping the insulator beneath the gate structure such that the work function differs between the central and edge regions of the gate structure. More particularly, such embodiments may include:

(1) Metal gate formation (e.g., using the known replacement metal gate technique) to create a hybrid polysilicon/metallic gate structure so as to alter the gate work function over the edge transistors 116 to a desired level. In such an approach, the polysilicon gate overlapping the edge transistors 116 in a region similar to the P+ implant regions 208, 208', 210, 210' of the earlier described embodiments may be fabricated with or modified by a different metal or metal-like material having a different work function relative to polysilicon. As an example, the implant regions labeled 208, 210 in FIG. 2A, which in the original example described above are formed from a P+ implant mask, could instead be a metal "plug" formed in the polysilicon gate structure 106. Various materials, typically either refractory metals or materials used to react with polysilicon to form a silicide, may be implanted, diffused, or otherwise formed in the masked regions 208, 210. Such metals or metal-like materials have their own metal work function, $\Phi_{MF}$, and therefore would set a different $Vt_E$ in the outer regions of the polysilicon gate structure 106 overlapping the edge transistors 116. A person of ordinary skill would choose a replacement metal or metal-like material for such outer regions which would raise $\Phi_{MF}$ and thereby lower leakage currents, just as the P+ implant does.

Figure 8:
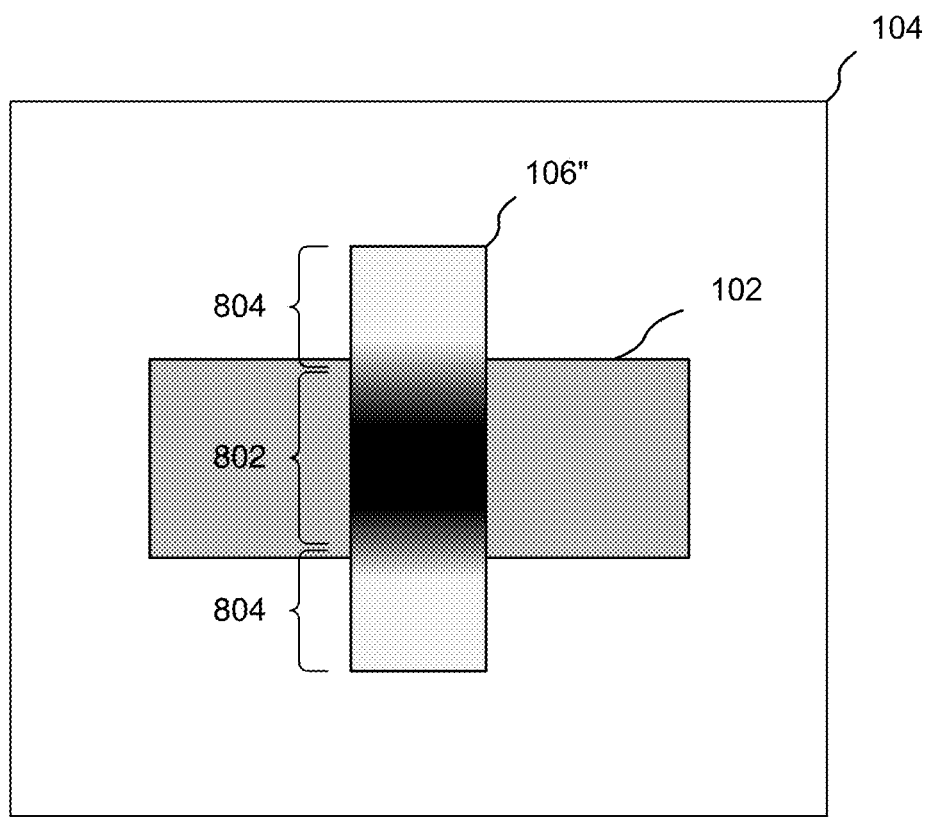
FIG. 8 is top plan view of a partially completed nFET having a bi-metallic gate overlaying an island of P-type silicon surrounded by $SiO_2$.

(2) Using a metal or metal-like gate structure (i.e., no polysilicon) with two different metals or metal-like materials in the central and edge regions of the gate structure. For example, this may be done by implanting or patterning a bi-metallic structure and then diffusing or sintering the metals or metal-like materials together. For example, FIG. 8 is top plan view of a partially completed nFET having a bi-metallic gate 106" overlaying an island of P-type silicon 102 surrounded by $SiO_2$ 104. As indicated by the gradient shading, the central portion 802 of the gate structure 106" is composed of a material (a metal or metal-like material, such as a silicide) different from the edge regions 804 of the gate structure 106". This approach would work on the same principle as variant (1) above, except that the overall gate structure would be made from metals or metal-like materials rather than from polysilicon and a metal or metal-like "plug". This approach may be useful to ensure the proper $Vt_E$ is set as compared to the $Vt_C$.

(3) Co-doping the gate structure with both N+ and P+ species to set the gate work function value to a different level. Referring to FIG. 2B, in such an approach, the notch in the mask for the N+ implant area 211 could be omitted, thereby allowing N+ doping of the portion of the polysilicon gate structure 106 overlying the edge transistors 116. With the rest of the process and design the same, the "missing" notched region would also be implanted with P+ in the implant regions 208, 210 (i.e., having the geometry shown in FIG. 2A), creating what a person of ordinary skill would recognize as degeneratively-doped polysilicon, for which $\Phi_{MF}$ is approximately mid band of the Si band gap. Such a hybrid material would change ΦMF by about half as much as a purely P+ implant into the implant regions 208, 210 (using a notched N+ implant mask 211) of the polysilicon gate structure 106, as in FIG. 2A. This smaller shift may, in many cases, be sufficient to raise $Vt_E$ sufficiently to make the edge leakage less than the central channel leakage, the desired goal. There would be less margin of error in this approach, but it would also eliminate a tightly controlled alignment step (since the notch in FIG. 2B must land within the gate width L, often the smallest dimension on an IC chip).

(4) Doping the insulator (generally a high K oxide, such as $HfO_2$) beneath the gate structure 106 with an ionic species (e.g., rare-earth metal oxides) to change the work-function of the gate stack by inducing a charged layer. In such an approach, inserting charge into the gate insulator at or near the edge transistors 116 would increase $Vt_E$ due to an offset in the threshold voltage equal to $Q/C_{OX}$, where Q is the implanted charge and $C_{OX}$ is the gate capacitance. This effect is known to a person of ordinary skill and has been widely used in non-volatile memory devices such as MNOS (metal-nitride-oxide-semiconductor) structures in which charge stored between the nitride and oxide layers serves to store information by shifting the Vt of the storing transistor. Doping the insulator may be by implantation through the overlying polysilicon, in known fashion. Such doping may produce a gradient conceptually similar to that shown in FIG. 8, with the insulator underneath the central portion 802 of the gate structure 106" having a different level of doping relative to the edge regions 804 of the gate structure 106".

In all of the variant embodiments, the work function $\Phi_{MF}$ of each edge region of the gate structure is increased sufficiently to increase the $Vt_E$ of each corresponding edge transistor to be approximately equal to or greater than $Vt_C$. The increase of the edge work function $\Phi_{MF}$ may be by forming or modifying (e.g., by implantation, diffusion, change of materials, hybrid N+/P+ doping, etc.) the gate structure over the edge transistors to have a different work function than the central region of the gate structure, or by modifying regions of the insulator beneath the gate structure such that the gate structure over the edge transistors has a different work function relative to the central region of the gate structure. Similar techniques may be used to alter the work function $\Phi_{MF}$ of the edge transistors of pFETs with suitable changes to the doping material and/or to the metal or metal-like materials used in a bi-metallic gate structure or a hybrid polysilicon/metallic gate structure; as a person of ordinary skill in the art will understand, in order to reduce edge leakage in a pFET, the $\Phi_{MF}$ of the edge transistor would be adjusted to be at least equal to or lower (rather than at least equal to or higher) than the $\Phi_{MF}$ of the central transistor.

While the invention is applicable to FETs of all widths, the invention is particularly useful for nFETs have small widths, since the contribution of the $Vt_E$ of the edge transistors is proportionately greater with respect to the $Vt_C$ of the central conduction channel.

In some fabricated examples of nFETs in which $Vt_E$ is modified utilizing the invention as described above, the $\Phi_{MF}$ of the gate structure and $Vt_E$ have increased by at least about 0.3 V (with some embodiments having an increase of more than 0.7V), and the current leakage of the edge transistors has been reduced by at least a factor of 10. In other example nFETs fabricated in accordance with the teachings of this invention, boron doping concentrations from about $1e^{13}/cm^2$ to about $1e^{15}/cm^2$ for the P+ implant regions have successfully reduced edge transistor current leakage by a substantial degree without needing flared gate structures. Experimental results shown that adding flaring gate structures provides an even greater reduction of edge transistor current leakage.

Methods

Another aspect of the invention includes methods for fabricating a FET on a siliconon-insulate substrate.

Figure 9:
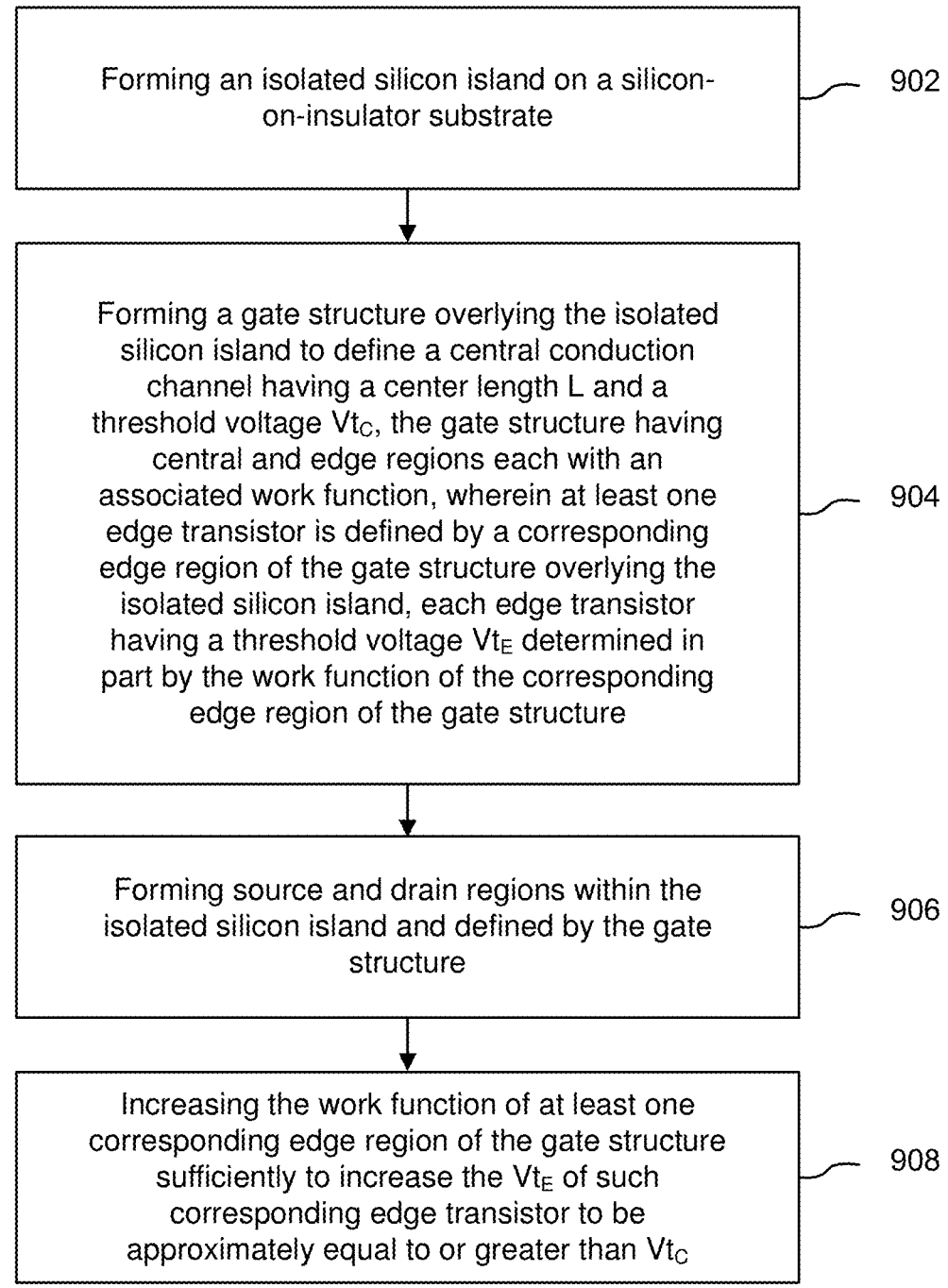
FIG. 9 is a process flow diagram showing a method for fabricating a FET on a silicon-on-insulator substrate.

FIG. 9 is a process flow diagram 900 showing a method for fabricating a FET on a silicon-on-insulator substrate, including: forming an isolated silicon island on a silicon-on-insulate substrate (STEP 902); forming a gate structure overlying the isolated silicon island to define a central conduction channel having a center length L and a threshold voltage $Vt_C$, the gate structure having central and edge regions each with an associated work function $\Phi_{MF}$, wherein at least one edge transistor is defined by a corresponding edge region of the gate structure overlying the isolated silicon island, each edge transistor having a threshold voltage $Vt_E$ determined in part by the work function $\Phi_{MF}$ of the corresponding edge region of the gate structure (STEP 904); forming source and drain regions within the isolated silicon island and defined by the gate structure (STEP 906); and increasing the work function $\Phi_{MF}$ of at least one corresponding edge region of the gate structure sufficiently to increase the $Vt_E$ of such corresponding edge transistor to be approximately equal to or greater than $Vt_C$ (STEP 908).

Figure 10:
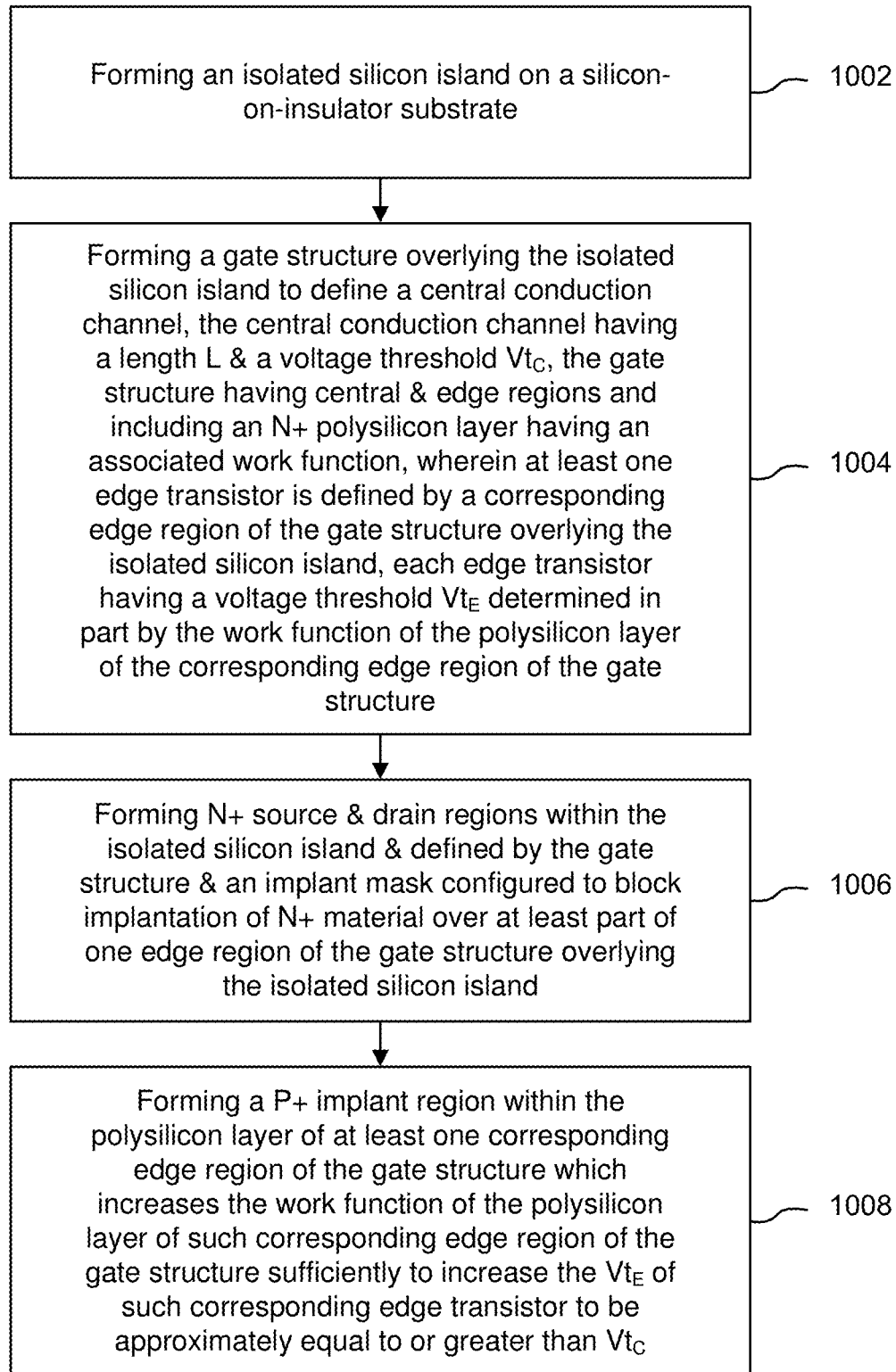
FIG. 10 is a process flow diagram showing a method for fabricating an NMOSFET on a silicon-on-insulator substrate.

FIG. 10 is a process flow diagram 1000 showing a method for fabricating an NMOSFET on a silicon-on-insulator substrate, including: forming an isolated silicon island on a silicon-on-insulate substrate (STEP 1002); forming a gate structure overlying the isolated silicon island to define a central conduction channel, the central conduction channel having a length L and a threshold voltage $Vt_C$, the gate structure having central and edge regions and including an N+ polysilicon layer having an associated work function $\Phi_{MF}$, wherein at least one edge transistor is defined by a corresponding edge region of the gate structure overlying the isolated silicon island, each edge transistor having a threshold voltage $Vt_E$ determined in part by the work function $\Phi_{MF}$ of the polysilicon layer of the corresponding edge region of the gate structure (STEP 1004); forming N+ source and drain regions within the isolated silicon island and defined by the gate structure and an implant mask configured to block implantation of N+ material over at least part of one edge region of the gate structure overlying the isolated silicon island (STEP 1006); and forming a P+ implant region within the polysilicon layer of at least one corresponding edge region of the gate structure which increases the work function $\Phi_{MF}$ of the polysilicon layer of such corresponding edge region of the gate structure sufficiently to increase the $Vt_E$ of such corresponding edge transistor to be approximately equal to or greater than $Vt_C$ (STEP 1008).

Any of the above methods may include one or more of the following: the FET being an NMOSFET; increasing the work function $\Phi_{MF}$ of the corresponding edge regions of the gate structure by implanting a P+ dopant within an implant region within such edge regions; the P+ implant region having a length $L_P$ less than or equal to length L; the source and drain regions being defined by a mask, and the shape of the mask approximately conforming to the shape of the P+ implant region within such edge regions; the P+ implant region within such edge regions being triangular shaped; the gate structure including an N+ polysilicon layer, and increasing the work function $\Phi_{MF}$ of the corresponding edge regions of the gate structure includes implanting a P+ dopant within the N+ polysilicon layer of such edge regions; flaring at least one edge region of the gate structure to a length $L^+$ greater than length L to increase the $Vt_E$ of the corresponding edge transistor compared to $Vt_C$; the increase in the work function $\Phi_{MF}$ and $Vt_E$ being at least about 0.3 V; a current leakage of at least one edge transistor with the increased work function $\Phi_{MF}$ being at least about 10 times less than the current leakage of such edge transistor without the increased work function (w; forming a body tie to one of the source region, the gate structure, or an external node; increasing the work function $\Phi_{MF}$ of the corresponding edge regions of the gate structure includes forming a metal or metal-like region within the edge regions of the gate structure such that the work function $\Phi_{MF}$ differs between the central and edge regions of the gate structure; increasing the work function $\Phi_{MF}$ of the corresponding edge portions of the gate structure includes forming the central region of the gate structure with a first metal or metal-like material, and forming the edge regions of the gate structure with a second metal or metal-like material, such that the work function $\Phi_{MF}$ differs between the central and edge regions of the gate structure; increasing the work function $\Phi_{MF}$ of the corresponding edge portions of the gate structure includes doping the edge regions of the gate structure to form degeneratively-doped polysilicon, such that the work function $\Phi_{MF}$ differs between the central and edge regions of the gate structure; increasing the work function $\Phi_{MF}$ of the corresponding edge portions of the gate structure includes doping an insulator beneath the gate structure, such that the work function $\Phi_{MF}$ differs between the central and edge regions of the gate structure; and/or increasing the work function $\Phi_{MF}$ of the corresponding edge portions of the gate structure includes forming the central region of the gate structure from a material having a first dopant, and modifying the edge regions of the gate structure with a second dopant, such that the work function ΦMF differs between the central and edge regions of the gate structure.

Fabrication Technologies & Options

The term "MOSFET", as used in this disclosure, means any field effect transistor (FET) with an insulated gate and comprising a metal or metal-like-insulator-semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies to the extent that the edge transistor phenomenon exists in such technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (e.g., from about 1 GHz to in excess of about 60 GHz). Monolithic IC implementation is particularly useful since parasitic capacitances generally can be kept low (or at a minimum, kept uniform across all units, permitting them to be compensated) by careful design.

A number of the figures show specific alignments of IC regions. As one of ordinary skill in the art would appreciate, perfect alignment of masks during IC fabrication may not be necessary, and in many cases is difficult or essentially impossible to achieve. Accordingly, IC design rules often allow regions or features to overlap to accommodate alignment error (for example, to ensure that all polysilicon regions are heavily doped by one or more dopant implant steps).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit fabricated on a silicon-on-insulator substrate and including at least one low-leakage field effect transistor (FET) that includes:
   (a) a gate structure having central and edge regions each having its own associated work function $\Phi_{MF}$;
   (b) a central conduction channel defined by the gate structure, the central conduction channel having a threshold voltage $Vt_C$ and a length L; and
   (c) at least one edge transistor defined by a corresponding edge region of the gate structure, each edge transistor having a threshold voltage $Vt_E$ determined in part by the work function $\Phi_{MF}$ of the corresponding edge region of the gate structure;
   wherein the work function $\Phi_{MF}$ of at least one corresponding edge region of the gate structure is modified sufficiently to increase the $Vt_E$ of such corresponding edge transistor to be approximately equal to or greater than $Vt_C$.

2. The invention of claim 1, wherein at least one FET is an NMOSFET and the work function $\Phi_{MF}$ of the corresponding edge regions of the gate structure is increased by the presence of a P dopant within a P implant region within such edge regions of the gate structure.

3. The invention of claim 2, wherein the P implant region has a length $L_P$ less than or equal to the length L.

4. An integrated circuit fabricated on a silicon-on-insulator substrate and including at least one low-leakage field effect transistor (FET) that includes:
   (a) a gate structure having a center length L, the gate structure having central and edge regions each having its own associated work function $\Phi_{MF}$;
   (b) source and drain regions defined by the gate structure;
   (c) a central conduction channel between the source and drain regions, the central conduction channel having a threshold voltage $Vt_C$; and
   (d) at least one edge transistor defined by a corresponding edge region of the gate structure, each edge transistor having a threshold voltage $Vt_E$ determined in part by the work function $\Phi_{MF}$ of the corresponding edge region of the gate structure;
   wherein the work function $\Phi_{MF}$ of at least one corresponding edge region of the gate structure is modified sufficiently to increase the $Vt_E$ of such corresponding edge transistor to be approximately equal to or greater than $Vt_C$.

5. The invention of claim 4, wherein at least one FET is an NMOSFET.

6. The invention of claim 5, wherein the work function $\Phi_{MF}$ of the corresponding edge regions of the gate structure is increased by the presence of a P dopant within a P implant region within such edge regions of the gate structure.

7. The invention of claim 6, wherein the P implant region has a length $L_P$ less than or equal to the length L.

8. The invention of claim 6, wherein the source and drain regions are encompassed by a masked implant area having a shape that approximately conforms to the shape of the P implant region within such edge regions.

9. The invention of claim 8, wherein the P implant region within such edge regions is rectangular or triangular shaped.

10. The invention of claim 5, wherein the gate structure includes an N+ polysilicon layer and the work function $\Phi_{MF}$ of the corresponding edge regions of the gate structure is increased by the presence of a P+ dopant within the N+ polysilicon layer of such edge regions.

11. The invention of claim 5, wherein the gate structure includes an N+ polysilicon layer and further including at least one P+ implant region formed within at least a portion of the gate structure and over a portion of the at least one edge transistor, wherein the work function $\Phi_{MF}$ of the corresponding edge regions of the gate structure is increased by the presence of the overlying at least one P+ implant region.

12. The invention of claim 4, wherein at least one FET is a PMOSFET.

13. The invention of claim 4, wherein the at least one edge region of the gate structure is flared to a length $L^+$ greater than the length L.

14. The invention of claim 4, wherein the increase in the work function $\Phi_{MF}$ and $Vt_E$ is at least about 0.3 V.

15. The invention of claim 4, wherein a current leakage of at least one edge transistor with the increased work function $\Phi_{MF}$ is at least about 10 times less than the current leakage of such edge transistor without the increased work function $\Phi_{MF}$.

16. The invention of claim 4, wherein the FET further includes a body tie to one of the source region, the gate structure, or an external node.

17. The invention of claim 4, wherein the work function $\Phi_{MF}$ of the corresponding edge regions of the gate structure is increased by the presence of a metal or metal-like region within the edge regions of the gate structure such that the work function $\Phi_{MF}$ differs between the central and edge regions of the gate structure.

18. The invention of claim 4, wherein the work function $\Phi_{MF}$ of the corresponding edge portions of the gate structure is increased by forming the central region of the gate structure with a first metal or metal-like material, and forming the edge regions of the gate structure with a second metal or metal-like material, such that the work function $\Phi_{MF}$ differs between the central and edge regions of the gate structure.

19. The invention of claim 4, wherein the gate structure is formed of polysilicon, and the work function $\Phi_{MF}$ of the corresponding edge portions of the gate structure is increased by the presence of a dopant within the edge regions of the gate structure to form degeneratively-doped polysilicon, such that the work function $\Phi_{MF}$ differs between the central and edge regions of the gate structure.

20. The invention of claim 4, wherein the work function $\Phi_{MF}$ of the corresponding edge portions of the gate structure is increased by the presence of a dopant within an insulator beneath the gate structure, such that the work function $\Phi_{MF}$ differs between the central and edge regions of the gate structure.

21. The invention of claim 4, wherein the work function $\Phi_{MF}$ of the corresponding edge portions of the gate structure is increased by forming the central region of the gate structure from a material having a first dopant, and modifying the edge regions of the gate structure with a second dopant, such that the work function $\Phi_{MF}$ differs between the central and edge regions of the gate structure.

* * * * *